(12) United States Patent
Fujita

(10) Patent No.: US 11,164,760 B2
(45) Date of Patent: Nov. 2, 2021

(54) ETCHING APPARATUS AND ETCHING METHOD

(71) Applicant: Tokyo Electron Limited, Tokyo (JP)

(72) Inventor: Akira Fujita, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/919,167

(22) Filed: Jul. 2, 2020

(65) Prior Publication Data
US 2021/0005465 A1    Jan. 7, 2021

(30) Foreign Application Priority Data

Jul. 4, 2019   (JP) .............................. JP2019-125380

(51) Int. Cl.
*H01L 21/67*   (2006.01)
*H01L 21/687*   (2006.01)
*H01L 21/311*   (2006.01)

(52) U.S. Cl.
CPC .... *H01L 21/6708* (2013.01); *H01L 21/31111* (2013.01); *H01L 21/68764* (2013.01)

(58) Field of Classification Search
None
See application file for complete search history.

(56) References Cited

U.S. PATENT DOCUMENTS

| | | | | |
|---|---|---|---|---|
| 7,780,867 B1 * | 8/2010 | Mayer | ................. | H01L 21/6708 216/83 |
| 9,704,730 B2 * | 7/2017 | Ookouchi | ......... | H01L 21/67051 |
| 9,847,239 B2 * | 12/2017 | Inatomi | ............. | H01L 21/67028 |
| 2012/0160273 A1 * | 6/2012 | Mizutani | ........... | H01L 21/67028 134/26 |
| 2016/0026087 A1 * | 1/2016 | Iseki | ........................ | G03F 7/32 430/434 |
| 2016/0111303 A1 * | 4/2016 | Nakamori | ......... | H01L 21/67051 134/18 |
| 2016/0296982 A1 * | 10/2016 | Hirakawa | ................. | B08B 5/04 |
| 2017/0287750 A1 * | 10/2017 | Amano | ............. | H01L 21/67253 |
| 2021/0005465 A1 * | 1/2021 | Fujita | ................ | H01L 21/68792 |

FOREIGN PATENT DOCUMENTS

JP          2014086638 A      5/2014

* cited by examiner

*Primary Examiner* — Sylvia Macarthur
(74) *Attorney, Agent, or Firm* — Pearne & Gordon LLP

(57) ABSTRACT

An etching apparatus includes a substrate holder configured to hold a substrate; a rotation driver configured to rotate the substrate holder around a rotation axis; a liquid discharge unit configured to discharge an etching solution to a peripheral portion of the substrate; and a controller configured to control an operation of the etching apparatus by controlling at least the rotation driver and the liquid discharge unit. The controller controls at least one of a rotational velocity of the substrate, a discharge velocity of the etching solution from the liquid discharge unit or a discharge direction of the etching solution from the liquid discharge unit to etch the substrate under immediate deviation conditions in which the etching solution is deviated from the substrate immediately after the etching solution from the liquid discharge unit lands at a liquid landing point in the peripheral portion of the substrate.

14 Claims, 9 Drawing Sheets

ETCHING APPARATUS AND ETCHING METHOD

CROSS-REFERENCE TO RELATED APPLICATION

This application claims the benefit of Japanese Patent Application No. 2019-125380 filed on Jul. 4, 2019, the entire disclosure of which is incorporated herein by reference.

TECHNICAL FIELD

The exemplary embodiments described herein pertain generally to an etching apparatus and an etching method.

BACKGROUND

In manufacturing of a semiconductor device, a process of removing any unnecessary film on a peripheral portion of a circular substrate, such as a semiconductor wafer, by wet etching with a chemical liquid is performed, and this process is called "bevel etching". Patent Document 1 discloses an apparatus for performing the bevel etching. The bevel etching apparatus disclosed in Patent Document 1 includes a vacuum chuck configured to hold a substrate in a horizontal posture and rotates the substrate around a vertical axis and a nozzle configured to supply a chemical liquid for etching to a peripheral portion of the substrate being rotated.

Patent Document 1: Japanese Patent Laid-open Publication No. 2014-086638

SUMMARY

In one exemplary embodiment, an etching apparatus includes a substrate holder configured to hold a substrate; a rotation driver configured to rotate the substrate holder around a rotation axis; a liquid discharge unit configured to discharge an etching solution to a peripheral portion of the substrate held by the substrate holder; and a controller configured to control an operation of the etching apparatus by controlling at least the rotation driver and the liquid discharge unit. The controller controls at least one of a rotational velocity of the substrate to be rotated by the rotation driver, a discharge velocity of the etching solution from the liquid discharge unit or a discharge direction of the etching solution from the liquid discharge unit to etch the substrate under immediate deviation conditions in which the etching solution is deviated from the substrate immediately after the etching solution discharged from the liquid discharge unit lands at a liquid landing point in the peripheral portion of the substrate.

The foregoing summary is illustrative only and is not intended to be in any way limiting. In addition to the illustrative aspects, exemplary embodiments, and features described above, further aspects, exemplary embodiments, and features will become apparent by reference to the drawings and the following detailed description.

BRIEF DESCRIPTION OF THE DRAWINGS

In the detailed description that follows, exemplary embodiments are described as illustrations only since various changes and modifications will become apparent to those skilled in the art from the following detailed description. The use of the same reference numbers in different figures indicates similar or identical items.

DETAILED DESCRIPTION

Figure 1:
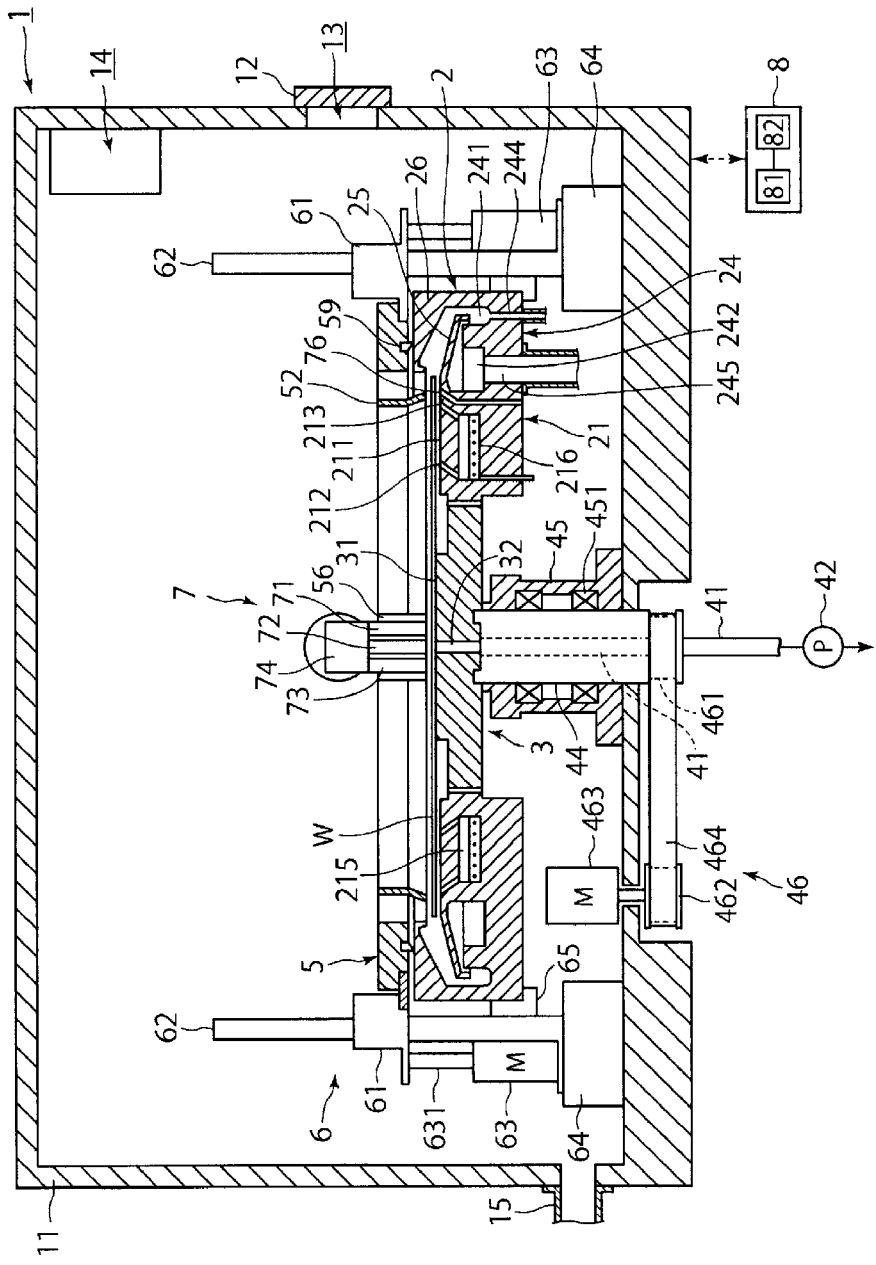
FIG. 1 is a longitudinal cross-sectional side view of an etching apparatus according to an exemplary embodiment.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other exemplary embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Hereinafter, a bevel etching apparatus as an exemplary embodiment of an etching apparatus will be described with reference to the accompanying drawings. The bevel etching apparatus is configured to remove any unnecessary film on a peripheral portion of a wafer W, which is a circular substrate and on which a semiconductor device is to be formed, by wet etching.

Figure 2:
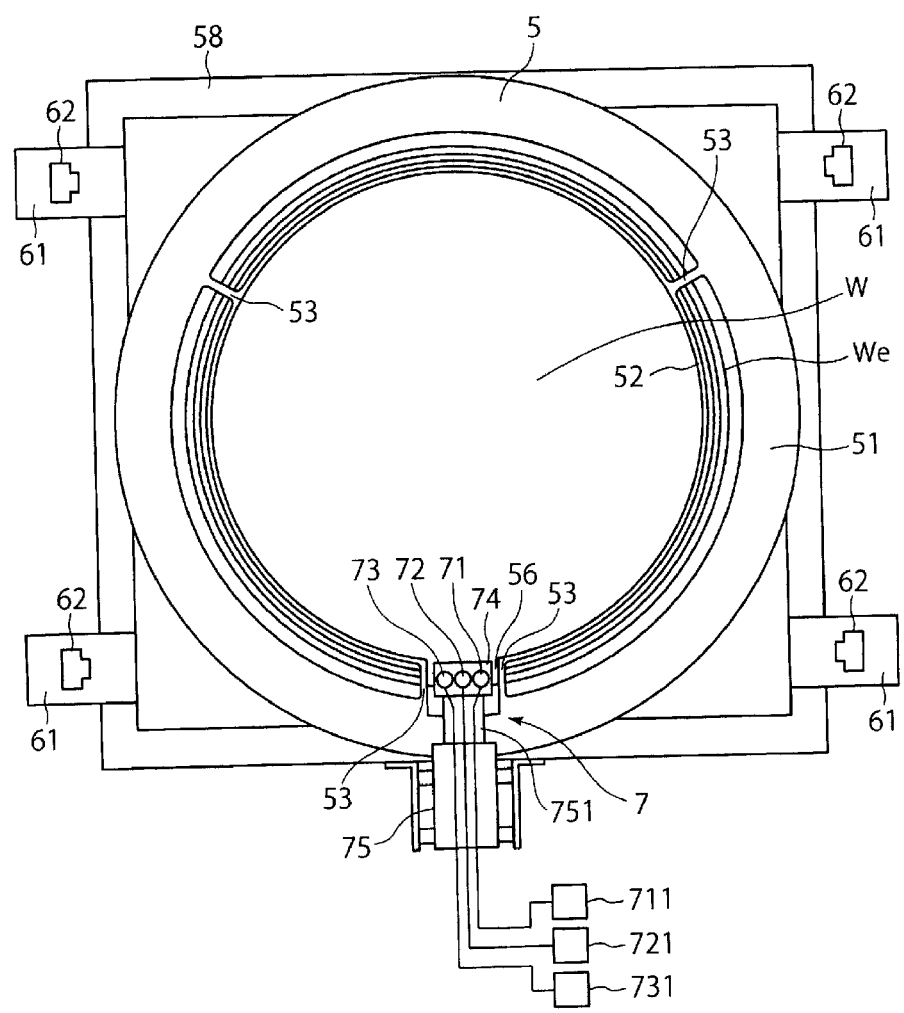
FIG. 2 is a plan view illustrating a cover member, an elevation mechanism therefor and a processing liquid supply of the etching apparatus illustrated in FIG. 1.

As illustrated in FIG. 1 and FIG. 2, a wet etching apparatus (hereinafter, simply referred to as "etching apparatus") 1 includes a wafer holder 3 configured to hold a wafer W rotatably around a vertical axis in a horizontal posture; a cup body 2 configured to surround the wafer W held by the wafer holder 3 and receive a processing liquid scattered from the wafer W; a cover member 5 having a ring-shaped protection wall 52 located above a peripheral portion of an upper surface of the wafer W held by the wafer holder 3; an elevation mechanism (moving mechanism) 6 configured to move the cover member 5 up and down; and a processing fluid supply 7 configured to supply a processing fluid to the wafer W held by the wafer holder 3.

The above-described components of the etching apparatus 1, such as, the cup body 2, the wafer holder 3 and the cover member 5, are accommodated in a single housing 11. A clean air introducing unit (fan filter unit) 14 configured to introduce clean air from the outside is provided near a ceiling of the housing 11. Further, an exhaust port 15 configured to exhaust an atmosphere inside the housing 11 is provided near a bottom surface of the housing 11. Thus, a downflow of the clean air is formed in the housing 11, flowing from an upper portion of the housing 11 toward a lower portion thereof. A carry-in/out port 13 is provided at a side wall of the housing 11 which is opened or closed by a shutter 12. A non-illustrated transfer arm of a wafer transfer mechanism provided outside the housing 11 may pass through the carry-in/out port 13 in a state where the wafer W is held thereon.

The wafer holder 3 (substrate holder) is configured as a circular plate-shaped vacuum chuck, and an upper surface of the wafer holder 3 is formed as a wafer attraction surface 31. A suction port 32 is opened at a central portion of the wafer attraction surface 31. A hollow cylindrical rotation shaft 44 extends vertically from a central portion of a lower surface of the wafer holder 3. A suction line (not illustrated) connected to the suction port 32 passes through an inner space of the rotation shaft 44. The suction line is connected to a vacuum pump 42 outside the housing 11. When the vacuum pump 42 is driven, the wafer W may be attracted by the wafer holder 3.

The rotation shaft 44 is supported by a bearing casing 45 in which a bearing 451 is embedded, and the bearing casing 45 is supported on the bottom surface of the housing 11. The rotation shaft 44 may be rotated at a desired rotation number by a rotation driving mechanism (rotation driver) 46 including a driven pulley 461 on the rotation shaft 44, a driving pulley 462 on a rotation shaft of a driving motor 463, and a driving belt 464 wound between the driven pulley 461 and the driving pulley 462.

Figure 3:
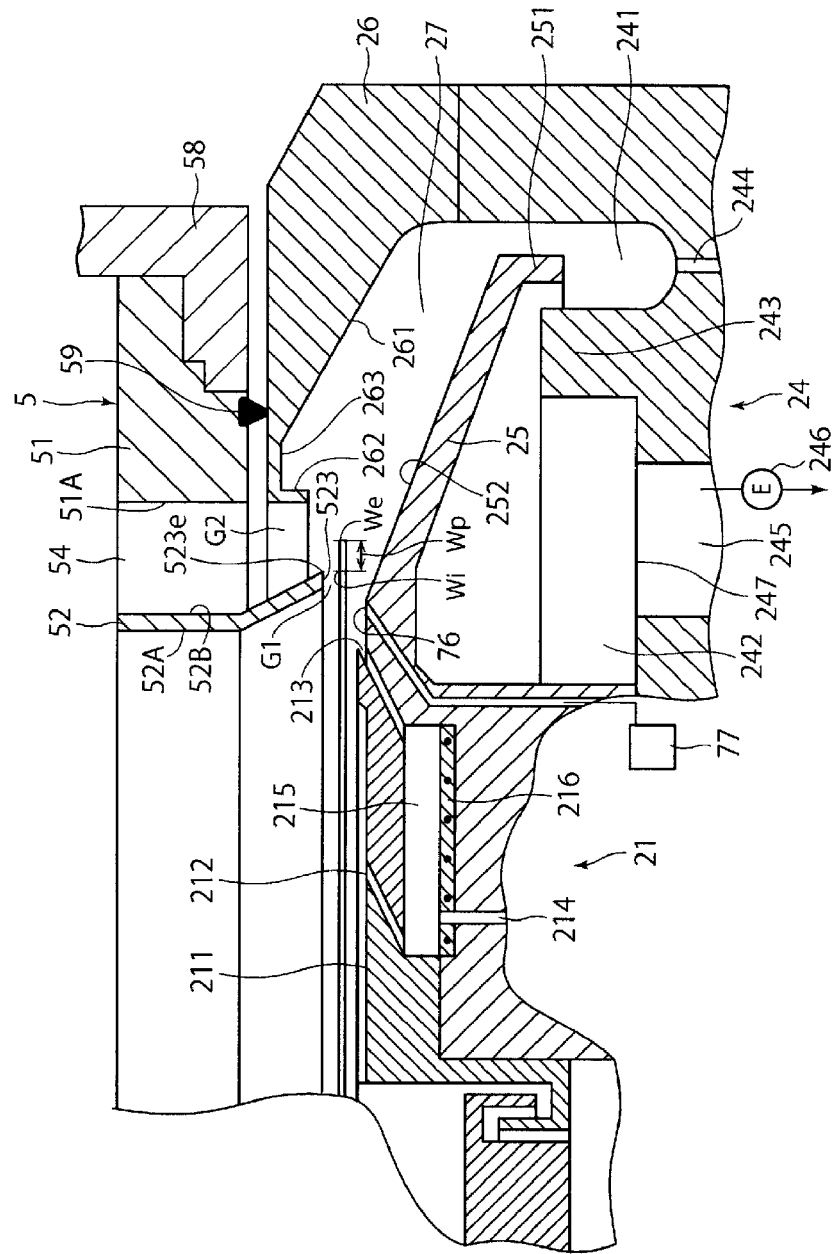
FIG. 3 is an enlarged cross-sectional view illustrating an area near an outer peripheral portion of a wafer on the right side of FIG. 1.

As illustrated in FIG. 3, the cup body 2 is a bottomed annular member configured to surround an outer peripheral portion of the wafer holder 3. The cup body 2 serves to receive and collect a chemical liquid scattered outwards from the wafer W after the chemical liquid is supplied to the wafer W, and serves to drain the chemical liquid to the outside.

A relatively small gap (e.g., having a height of about 2 mm to 3 mm) is formed between a lower surface of the wafer W held by the wafer holder 3 and an upper surface 211 of an inner peripheral portion 21 of the cup body 2 facing the lower surface of the wafer W. Two gas discharge openings 212 and 213 are opened on the upper surface 211 facing the wafer W. The two gas discharge openings 212 and 213 extend continuously along the concentric large-diameter circumference and small-diameter circumference, respectively, and discharge hot $N_2$ gas (heated nitrogen gas) toward the lower surface of the wafer W in a radially outward and obliquely upward direction.

The $N_2$ gas is supplied from one or a plurality of gas introduction lines 214 (only one illustrated in the drawing) formed in the inside of the inner peripheral portion 21 of the cup body 2 to an annular gas diffusion space 215. The $N_2$ gas flows through the gas diffusion space 215 while being diffused in the circumferential direction, and is discharged from the gas discharge openings 212 and 213. A heater 216 is provided near the gas diffusion space 215. The $N_2$ gas is heated when flowing through the gas diffusion space 215, and then discharged from the gas discharge openings 212 and 213. The $N_2$ gas discharged from the gas discharge opening 213, which is located at a radially outer position, heats up the peripheral portion of the wafer W, which is a processing target portion, to accelerate a reaction with the chemical liquid. Also, the $N_2$ gas suppresses the flow of the mist of the processing liquid, which has been discharged toward a front surface (upper surface) of the wafer W and then scattered, to the rear surface (lower surface) of the wafer W. The $N_2$ gas discharged from the gas discharge opening 212, which is located at a radially inner position, suppresses deformation of the wafer W. The deformation may be caused by heating only the peripheral portion of the wafer W without the gas discharge opening 212 and by generating a negative pressure near the lower surface of the wafer W at a central side of the wafer W.

In an outer peripheral portion 24 of the cup body 2, two top-opened annular recesses 241 and 242 are formed along the circumferential direction of the cup body 2. The recesses 241 and 242 are partitioned from each other by an annular separation wall 243. A drain path 244 is connected to a bottom of the recess 241 disposed at an outer position (outer recess). Further, an exhaust port 247 is provided in a bottom of the recess 242 disposed at an inner position (inner recess), and an exhaust path 245 is connected to the exhaust port 247. An exhaust apparatus 246, such as an ejector or a vacuum pump, is connected to the exhaust path 245. During the operation of the etching apparatus 1, an inner space of the cup body 2 is normally exhausted via the exhaust path 245 to maintain a pressure within the inner recess 242 lower than a pressure within the housing 11 which is outside the cup body 2.

An annular guide plate 25 extends from an outer periphery of the inner peripheral portion 21 of the cup body 2 (which is located under the peripheral portion of the wafer W) toward the radial outside. The guide plate 25 is inclined to become lowered as it goes in the radially outward direction. The guide plate 25 covers the entire inner recess 242 and an upper part of an inner peripheral portion of the outer recess 241. A front end 251 of the guide plate 25 (a radially outer peripheral portion) is bent downwards to enter into the outer recess 241.

Further, an outer peripheral wall 26 which is continuous with an outer wall surface of the outer recess 241 is provided in the outer periphery of the outer peripheral portion 24 of the cup body 2. An inner peripheral surface of the outer peripheral wall 26 receives fluid (e.g., liquid droplets, gas and a mixture thereof) scattered outwards from the wafer W, and guides the fluid toward the outer recess 241. The outer peripheral wall 26 includes a fluid receiving surface 261 at the inner side thereof, which is inclined at an angle of 25° to 30° with respect to the horizontal surface to be lowered toward the radial outside, and a return portion 262 extending downwards from an upper end of the fluid receiving surface 261. An exhaust flow path 27 through which the gas (e.g., air or $N_2$ gas) and the liquid droplets scattered from the wafer W flow is formed between an upper surface 252 of the guide plate 25 and the fluid receiving surface 261.

A mixed fluid of the gas and the liquid droplets introduced through the exhaust flow path 27 into the outer recess 241 flows between the guide plate 25 and the separation wall 243 to be introduced into the inner recess 242. When the mixed fluid passes between the guide plate 25 and the separation wall 243, a flow direction of the mixed fluid is sharply turned. Accordingly, the liquid (droplets) included in the mixed fluid is separated from the fluid by being collided with the front end 251 of the guide plate 25 or the separation wall 243, introduced into the outer recess 241 along a lower surface of the guide plate 25 or the surface of the separation wall 243, and discharged from the drain path 244. The fluid from which the liquid droplets are removed is introduced into the inner recess 242, and then discharged from the exhaust path 245.

The cover member 5 is a generally ring-shaped member placed to face a peripheral portion of an upper opening of the cup body 2 when the processing is performed.

As illustrated in FIG. 1 to FIG. 3, the cover member 5 includes a ring-shaped base 51, a ring-shaped protection wall 52 placed inside the base 51 and a plurality of connection members 53 that connect the base 51 and the protection wall 52. A circumferential gap 54 extending along the circumferential direction is formed between an inner surface (inner peripheral surface) 51A of the base 51 and an outer surface (outer peripheral surface) 52B of the protection wall 52. The circumferential gap 54 is divided at the positions of the connection members 53.

A lower end 523 of the protection wall 52 (specifically, both of the outer periphery and the inner periphery of the lower end 523) is located more inward than an outer peripheral end (edge) We of the wafer W. A first gap G1 is formed between the lower end 523 and the upper surface of the wafer W. Further, a second gap G2 is formed between the wall surface that defines the upper opening of the cup body 2 (the inner peripheral surface of the return portion 262) and the outer surface 52B of the protection wall 52. The second gap G2 is connected to the circumferential gap 54 formed between the inner surface 51A of the base 51 of the cover member 5 and the outer surface 52B of the protection wall 52.

The protection wall 52 has a function as a shield to suppress re-adherence of the processing liquid, which is supplied to the wafer W and then scattered outwards from the wafer W, on the wafer W, and a function to rectify a gas flow drawn from an upper side of the wafer W into the cup body 2.

In the exemplary embodiment, a radial position of an outer periphery 523e of the lower end 523 of the protection wall 52 may be in approximately accord with a radial position of an inner periphery Wi of a peripheral portion Wp of the wafer W. Here, the "peripheral portion Wp of the wafer W" (see FIG. 3) refers to a circular ring-shaped region from a circumscribed circle (i.e., a circle concentric with the wafer W and having a minimum radius in order not to include a device forming region in the outside of this circle) to the edge We (also referred to as APEX) of the wafer W. Further, the "inner periphery Wi of the peripheral portion Wp of the wafer W" is in accord with the circumscribed circle.

FIG. 2 is a plan view illustrating a state where the wafer W is held by the wafer holder 3 and the cover member 5 is located at a processing position. In FIG. 2, symbol We represents the outer peripheral end (edge) of the wafer W.

As illustrated in FIG. 1 and FIG. 2, the elevation mechanism 6 configured to move the cover member 5 up and down includes a plurality of (four in this example) sliders 61 fixed to a support 58 configured to support the cover member 5, and guide columns 62 that penetrate the respective sliders 61 and extend vertically. A rod 631 of a linear actuator, for example, a cylinder motor 63 is connected to each of the sliders 61. When the cylinder motor 63 is driven, the sliders 61 are moved up and down along the guide columns 62 and thus can move the cover member 5 up and down. The cup body 2 is supported by a lifter 65 which is a part of a cup elevation mechanism (which is not illustrated in detail). As the lifter 65 is moved down from the state illustrated in FIG. 1, the cup body 2 is moved down, and, thus, the wafer W can be transferred between the transfer arm of the wafer transfer mechanism (not illustrated) and the wafer holder 3.

The cup body 2, the wafer holder 3 and the cover member 5 may be configured as described in Patent Document 1 (Japanese Patent Laid-open Publication No. 2014-086638) (which is a patent publication relating to a patent application previously filed by the present applicant). Otherwise, the cup body 2, the wafer holder 3 and the cover member 5 may be configured as described in Japanese Patent Laid-open Publication No. 2014-086639 which relates to another patent application previously filed by the present applicant.

Hereinafter, referring to FIG. 1, FIG. 2, FIG. 4A and FIG. 4B and FIG. 5, the processing fluid supply 7 will be described. As illustrated in FIG. 2, the processing fluid supply 7 includes three front surface nozzles 71, 72 and 73 each configured to supply a processing fluid to the peripheral portion of the front surface of the wafer W. Specifically, the processing fluid supply 7 includes a chemical liquid nozzle 71 configured to discharge a chemical liquid (HF (hydrofluoric acid) as the etching solution in this example), a rinse nozzle 72 configured to discharge a rinse liquid (deionized water (DIW) in this example), and a gas nozzle 73 configured to discharge a gas for drying ($N_2$ gas in this example). The chemical liquid nozzle 71, the rinse nozzle 72 and the gas nozzle 73 are provided in a common nozzle holder 74. The nozzle holder 74 is provided at a rod 751 of a linear actuator, for example, a cylinder motor 75, which is provided in the support 58 configured to support the cover member 5. When the cylinder motor 75 is driven, supply positions of the processing fluids from the front surface nozzles 71 to 73 onto the wafer W may be moved in a radial direction of the wafer W.

Figure 4A:
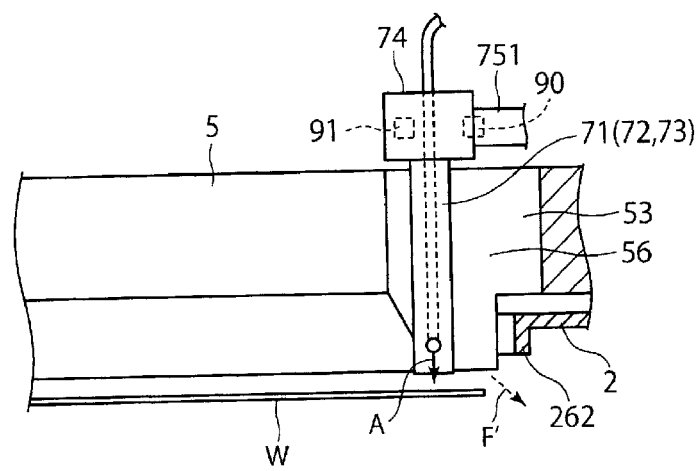
FIG. 4A and FIG. 4B are schematic diagrams illustrating a front surface nozzle.
Figure 4B:
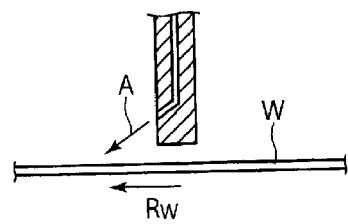

As illustrated in FIG. 2 and FIG. 4A, the front surface nozzles 71 to 73 are accommodated in a recess 56 which is formed in an inner peripheral surface of the cover member 5. The recess 56 is interposed between two connection members 53. Each of the nozzles 72 and 73 is directed obliquely downwards, as indicated by an arrow A in FIG. 4B, and discharges the processing fluid such that the discharge direction indicated by the arrow A has a component of a rotation direction Rw of the wafer. A discharge direction of the chemical liquid from the front surface nozzle 71 (chemical liquid nozzle 71) will be described later. By supplying the rinse liquid from the front surface nozzle 72 (rinse nozzle 72) toward the direction illustrated in FIG. 4B, it is possible to suppress the generation of the liquid droplet caused by the collision of the rinse liquid with the wafer W. The processing fluids are supplied from processing fluid supply mechanisms 711, 721 and 731 as schematically illustrated in FIG. 2 to the front surface nozzles 71 to 73, respectively. Each of the processing liquid supply mechanisms 711, 721 and 731 may be equipped with a processing fluid source such as a tank or a factory power supply, a pipeline configured to supply the processing fluid from the processing fluid source to the front surface nozzle, and a flow rate control device such as an opening/closing valve or a flow rate control valve provided at the pipeline.

If different kinds of chemical liquids, for example, an acidic chemical liquid and an alkaline chemical liquid are supplied to a single wafer W, another set of nozzles identical to the above-described set of the nozzles 71 to 73 may be further provided. This set of nozzles may be accommodated in another recess (not illustrated) which is identical to the above-described recess 56 formed in the inner peripheral surface of the cover member 5 and located far from the recess 56 in the circumferential direction of the cover body 5. Also, a chemical liquid to be supplied from this set of nozzles is not limited to the etching solution and may be, for example, a chemical cleaning liquid for removing etching residues.

Desirably, at least the chemical liquid nozzle 71 among the front surface nozzles 71 to 73 may be provided such that the discharge direction of the etching solution (chemical liquid) discharged from the chemical liquid nozzle 71 can be changed. Specifically, for example, as schematically illustrated in FIG. 4A, a nozzle holder rotation mechanism (nozzle direction control mechanism) 90 configured to rotate the nozzle holder 74 around a horizontal axis may be provided. The nozzle holder rotation mechanism 90 may be provided, for example, between the rod 751 and the nozzle holder 74. The nozzle holder rotation mechanism 90 may be a mechanism configured to rotate the rod 751 around the horizontal axis. A direction of the chemical liquid nozzle 71 may also be changed by a mechanism configured to rock the entire cylinder motor 75. Also, as schematically illustrated in FIG. 4A, a nozzle rotation mechanism (nozzle direction control mechanism) 91 configured to rotate at least the chemical liquid nozzle 71 around a vertical axis may be provided in the nozzle holder 74. As long as the discharge direction of the chemical liquid from the chemical liquid nozzle 71 can be changed, a nozzle direction control mechanism other than the above-described nozzle direction control mechanisms 90 and 91 may be provided. Since the nozzle direction control mechanism is provided, at least one of an angle $\phi$ or an angle $\theta$ which will be described later can be changed.

Also, as illustrated in FIG. 3, the processing fluid supply 7 is equipped with a plurality of rear surface nozzles 76 (only one illustrated in FIG. 3) configured to supply a processing fluid to a peripheral portion of the rear surface of the wafer W. The plurality of rear surface nozzles 76 is formed at different positions in the circumferential direction (of the cup body 2) in the outside of the gas discharge opening 213 of the inner peripheral portion 21 of the cup body 2. The rear surface nozzles 76 are formed as holes penetrating an outer peripheral portion of the upper surface 211 of the inner peripheral portion 21 of the cup body 2. The rear surface nozzles 76 are directed obliquely upwards and discharge the processing liquid toward the peripheral portion of the lower surface of the wafer W and also toward the outside of the wafer W. A chemical liquid identical to the chemical liquid discharged from the chemical liquid nozzle 71 (or a chemical liquid nozzle in another set of nozzles) may be discharged from at least one of the rear surface nozzles 76. Also, a rinse liquid identical to the rinse liquid discharged from the rinse nozzle 72 may be discharged from at least another one of the rear surface nozzles 76. As illustrated in FIG. 3, each of the rear surface nozzles 76 is connected to a processing fluid supply mechanism 77 having the same configuration as the above-described processing fluid supply mechanisms 711 and 721.

Figure 5:
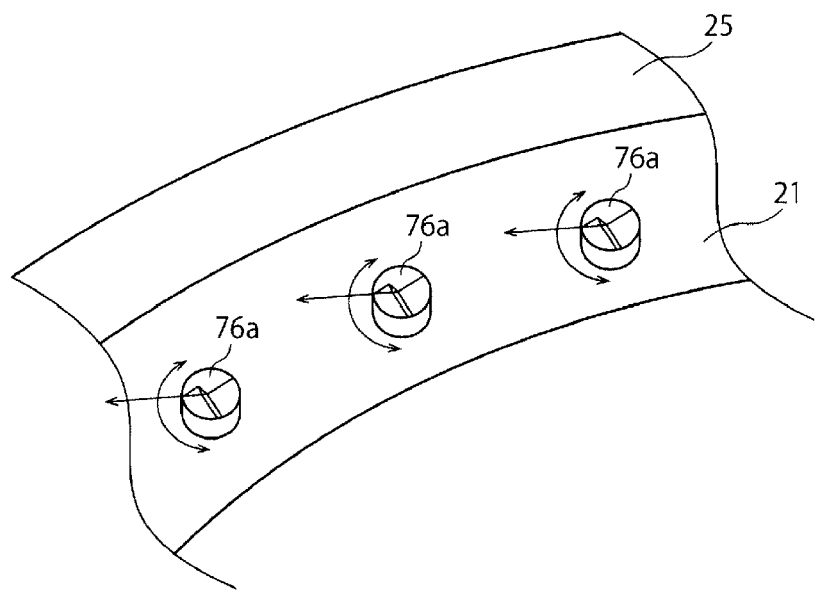
FIG. 5 is a schematic perspective view illustrating a rear surface nozzle.

A mechanism configured to change the discharge direction of the chemical liquid may also be provided in at least one rear surface nozzle 76 for discharging the chemical liquid among the plurality of rear surface nozzles 76. Specifically, for example, as illustrated in FIG. 5, a discharge member 76a (which is itself a rear surface nozzle) configured to be rotated around a vertical axis may be provided at the position where the rear surface nozzle 76 (hole) is formed, as illustrated in FIG. 3, in the upper surface 211 of the inner peripheral portion 21 of the cup body 2. A non-illustrated rotary actuator may be provided to rotate the discharge member 76a. The discharge member 76a includes a discharge opening which is directed obliquely upwards and discharges a liquid. Therefore, the discharge direction of the liquid discharged from the discharge member 76a can be changed by rotating the discharge member 76a around the vertical axis. The discharge member 76a may be provided to be rotatable around a horizontal axis.

As schematically illustrated in FIG. 1, the etching apparatus 1 includes a controller 8 configured to integrally control all operations thereof. The controller 8 controls the operations of all functional components of the etching apparatus 1 (for example, the rotation driving mechanism 46, the elevation mechanism 6, the vacuum pump 42, and various processing fluid supply mechanisms). The controller 8 may be implemented using, for example, a general purpose computer as hardware and programs (an apparatus control program and a processing recipe) to operate the computer as software. The software may be stored in a storage medium such as a hard disc drive which is statically installed in the computer, or in a storage medium such as a CD-ROM, a DVD and a flash memory which are detachably set in the computer. The storage medium is denoted by a reference numeral 81 in FIG. 1. A processor 82 retrieves and executes a predetermined processing recipe from the storage medium 81 based on instructions from a non-illustrated user interface as needed. As a result, each functional component of the etching apparatus 1 is operated to perform a predetermined processing under the control of the controller 8.

Hereinafter, the operation of the etching apparatus 1 performed under the control of the controller 8 will be described.

[Carry-in of Wafer]

First, the cover member 5 is located at a retreat position (higher than the position illustrated in FIG. 1) by the elevation mechanism 6, and the cup body 2 is moved down by the lifter 65 of the cup elevation mechanism. Subsequently, the shutter 12 of the housing 11 is opened to allow the transfer arm (not illustrated) of the non-illustrated external wafer transfer mechanism to enter the housing 11. Then, the wafer W held by the transfer arm is located just above the wafer holder 3. Subsequently, the transfer arm is moved down to a position lower than the upper surface of the wafer holder 3 to place the wafer W on the upper surface of the wafer holder 3. Then, the wafer W is attracted by the wafer holder 3. Thereafter, the empty transfer arm is retreated from the inside of the housing 11. Then, the cup body 2 is moved up to return to the position illustrated in FIG. 1, and the cover member 5 is moved down to the processing position illustrated in FIG. 1. According to the above-mentioned sequence, the carry-in of the wafer is completed, and the wafer W is in the state illustrated in FIG. 1. That is, the wafer W is held by the wafer holder 3 in a state where the front surface of the wafer W faces upwards and the rear surface of the wafer W faces downwards.

[Etching Processing (Chemical Liquid Processing)]

Then, an etching processing is performed on the wafer W. The wafer W is rotated, and the hot $N_2$ gas is discharged from the gas discharge openings 212 and 213 of the cup body 2 to heat the wafer W, particularly the peripheral portion of the wafer W which is the processing target region, to a temperature (e.g., about 60° C.) suitable for the etching processing. Further, when performing a chemical liquid processing which does not require the heating of the wafer W, the $N_2$ gas at room temperature may be discharged without operating the heater 216. When the wafer W is heated sufficiently, the etching solution (chemical liquid for the etching, e.g., HF) is supplied from the chemical liquid nozzle 71 to the peripheral portion of the front surface of the wafer W while rotating the wafer W to remove any unnecessary film on the peripheral portion of the front surface of the wafer W. At the same time, the chemical liquid may be supplied from the rear surface nozzle 76 to the peripheral portion of the rear surface of the wafer W to remove any unnecessary film on the peripheral portion of the rear surface of the wafer W as needed. The chemical liquid is scattered to the outside of the wafer W together with materials (reaction products) derived from the removed film and then recovered by the cup body 2. The supply conditions of the etching solution to the wafer W and the behavior of the etching solution will be described in detail later.

Herein, the inner space of the cup body 2 is sucked through the exhaust path 245 and maintained at a negative pressure. Thus, the gas (clean air introduced into the housing 11 from the clean air introducing unit 14) above the front surface of the wafer W is introduced into the exhaust flow path 27 inside the cup body 2 through the first gap G1 and the second gap G2. Also, the $N_2$ gas discharged from the gas discharge openings 212 and 213 is flown out of the space between the upper surface 211 of the internal peripheral portion 21 of the cup body 2 and the rear surface of the wafer W by the rotation of the wafer W and then flown into the exhaust flow path 27. Since the flows of the above-described gases (clean air and $N_2$ gas) are formed, the liquid droplets or the mist of the chemical liquid scattered (deviated) from the wafer W flow down the exhaust flow path 27 along with the gas flows and go away from near the peripheral portion of the wafer W. Therefore, it is possible to suppress the re-adherence of the chemical liquid, which is deviated from the wafer W, on the wafer W.

[Rinse Processing]

After the chemical liquid processing is performed for a predetermined period of time, a rinse processing is subsequently performed by continuing the rotation of the wafer W and the discharge of the $N_2$ gas from the gas discharge openings 212 and 213, stopping the discharge of the chemical liquid from the chemical liquid nozzle 71 and the rear surface nozzle 76 for the chemical liquid, and supplying the rinse liquid (DIW) from the rinse nozzle 72 and the rear surface nozzle 76 for the rinse liquid to the peripheral portion of the wafer W. Through the rinse processing, the chemical liquid and any reaction products remained on the front and rear surfaces of the wafer W are washed out.

After the rinse processing, a chemical liquid cleaning processing may be performed to remove etching residues produced during the etching processing and then the rinse processing may be performed again.

[Dry Processing]

After the rinse processing is performed for a predetermined period of time, a dry processing is subsequently performed by continuing the rotation of the wafer W and the discharge of the $N_2$ gas from the gas discharge openings 212 and 213, stopping the discharge of the rinse liquid from the rinse nozzle 72 and the rear surface nozzle 76 for the rinse liquid, and supplying the gas for the drying ($N_2$ gas) from the gas nozzle 73 to the peripheral portion of the wafer W. By the above-described procedure, a series of processings for the wafer W are completed.

In the rinse processing and the dry processing, the same gas flows are formed inside and around the cup body 2 as in the chemical liquid processing. The liquid scattered from the wafer W flows down the exhaust flow path 27 along with gas flows and goes away from near the peripheral portion of the wafer W.

[Carry-Out of Wafer]

Thereafter, the cover member 5 is moved up to be located at the retreat position, and the cup body 2 is moved down. Subsequently, the shutter 12 of the housing 11 is opened to allow the transfer arm (not illustrated) of the non-illustrated external wafer transfer mechanism to enter the housing 11. Then, the empty transfer arm is located below the wafer W held by the wafer holder 3, and then moved up to receive the wafer W from the wafer holder 3 in a state where the attraction of the wafer W is stopped. Thereafter, the transfer arm holding the wafer W is retreated from the inside of the housing 11.

Hereinafter, various parameters for explaining discharge conditions of the etching solution CHM discharged to the front surface of the wafer W from the chemical liquid nozzle 71 will be described with reference to FIG. 6.

Figure 6:
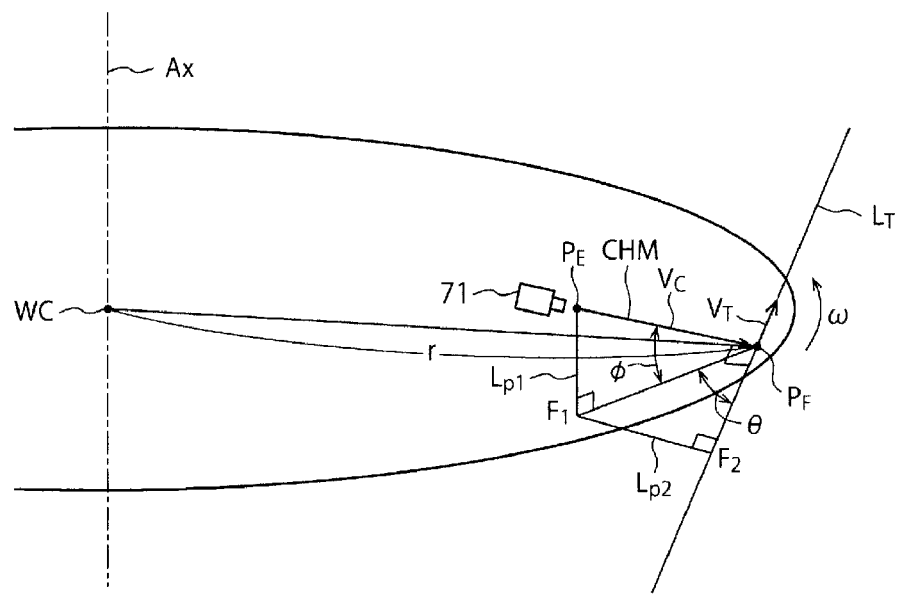
FIG. 6 is a diagram provided to explain definitions of various parameters in an etching processing.

In FIG. 6, the symbols are defined as follows:

$A_X$: Rotation axis of the wafer W $W_C$: Intersection point between the front surface of the wafer W and the rotation axis $A_X$ (Rotation center of the wafer W on the front surface of the wafer W)

$P_E$: Discharge point of the etching solution CHM (Discharge opening of the chemical liquid nozzle 71)

$P_F$: Liquid landing point of the etching solution CHM on the front surface of the wafer W ω: Angular velocity of the wafer W r: Distance from the rotation center $W_C$ to the liquid landing point $P_F$ $L_T$: Tangent at the liquid landing point $P_F$ on a circumference of a circle (located on the same plane as the front surface of the wafer W) having a radius r around the rotation center $W_C$ $V_T$: Tangential velocity (=ωr) of the wafer W at the liquid landing point $P_F$ $V_C$: Velocity (Magnitude of velocity vector) of the etching solution CHM from the discharge point $P_E$ toward the liquid landing point $P_F$ $F_1$: Foot of a perpendicular line $L_{P1}$ drawn from the discharge point $P_E$ to the front surface of the wafer W $F_2$: Foot of a perpendicular line $L_{P2}$ drawn from the foot $F_1$ to the tangent $L_T$ φ: Angle between a line segment $P_E P_F$ and a line segment $F_1 P_F$ θ: Angle between the line segment $F_1 P_F$ and a line segment $F_2 P_F$ Desirably, a direction of a tangential direction component ($V_T$ direction component) of the velocity vector of the etching solution CHM may be the same as a rotation direction of the wafer W. If it is opposite to the rotation direction of the wafer W, it is difficult to control scattering (liquid splashing) of the etching solution CHM. However, if there is no problem in controlling the scattering of the etching solution CHM, the direction of the tangential direction component of the velocity vector of the etching solution CHM may be opposite to the rotation direction of the wafer W.

As a result of the research of the inventors, it has been found that as the value of $V_T/(V_C \times \cos \phi \times \cos \theta)$ increases, the etching solution CHM discharged from the chemical liquid nozzle 71 deviates from the wafer W immediately after landing at the liquid landing point $P_F$ and is not diffused on the front surface of the wafer W from the liquid landing point $P_F$. Such a behavior of the etching solution is referred to as "immediate deviation" of the etching solution and conditions causing the immediate deviation of the etching solution are referred to as "immediate deviation conditions". Also, when the etching solution deviates immediately, the etching solution appears to splash on the front surface of the wafer W.

As the value of $V_T/(V_C \times \cos \phi \times \cos \theta)$ decreases, the etching solution CHM discharged from the chemical liquid nozzle 71 lands at the liquid landing point $P_F$ and diffuses on the front surface of the wafer W to cover (wet) an area radially outside the liquid landing point $P_F$, and then, deviates from the wafer W. Such a behavior of the etching solution is referred to as "diffusion (or deviation after diffusion") of the etching solution and conditions causing the diffusion of the etching solution are referred to as "diffusion conditions".

If the conditions such as a viscosity of the etching solution and a wetting property of the etching solution with respect to the front surface of the wafer W are changed, the value of $V_T/(V_C \times \cos \phi \times \cos \theta)$ at which the immediate deviation of the etching solution occurs is changed. However, there is still a tendency that when the value of $V_T/(V_C \times \cos \phi \times \cos \theta)$ increases, the immediate deviation of the etching solution occurs and when the value of $V_T/(V_C \times \cos \phi \times \cos \theta)$ decreases, the diffusion of the etching solution occurs.

As long as the relationship between parameters to establish the immediate deviation conditions are understood by those skilled in the art, it is easy for those skilled in the art to find the immediate deviation conditions by carrying out a simple preliminary test on combinations of a surface state (wetting property with respect to the etching solution) of the wafer W and a state (viscosity, surface tension, etc.) of the etching solution. For example, it is easy to find the immediate deviation conditions by fixing three of the four parameters ($V_T$, $V_C$, $\cos \phi$, $\cos \theta$) at appropriate values and monitoring the behavior of the etching solution after landing while changing a value of the rest parameter. Also, for example, if the immediate deviation conditions cannot be found even when $\theta$ is changed to decrease $\cos \theta$, the immediate deviation conditions can be found by fixing $\theta$ at an appropriately high value and changing $\phi$ to decrease $\cos \phi$.

The tangential velocity $V_T$ of the wafer W at the liquid landing point $P_F$ changes in proportion to a rotational velocity of the wafer W. Therefore, the rotational velocity (i.e., the rotation number per unit time) of the wafer W may be changed to control $V_T$.

The velocity $V_C$ of the etching solution CHM from the discharge point $P_E$ toward the liquid landing point $P_F$ changes in proportion to a discharge flow rate of the etching solution as long as the same nozzle is used. Therefore, the flow rate of the etching solution to be supplied to the nozzle may be controlled to control $V_C$.

The angles $\phi$ and $\theta$ may be controlled by changing the direction of the chemical liquid nozzle 71. To change both the angles $\phi$ and $\theta$, a biaxial nozzle angle changing mechanism (e.g., both the above-described rotation mechanisms 90 and 91) is needed. To avoid complexity in the structure of the nozzle angle changing mechanism, only one of the angles $\phi$ and $\theta$ may be changed. Even in this case, the value of $V_C \times \cos \phi \times \cos \theta$ can be controlled.

The value of $V_C \times \cos \phi \times \cos \theta$ can be controlled just by controlling $V_C$ (i.e., controlling the flow rate of the etching solution to be supplied to the chemical liquid nozzle 71). Therefore, if there is no need to change the value of $V_C \times \cos \phi \times \cos \theta$ in a wide range by reason of limited processings to be performed by a substrate processing apparatus, the value of $V_C \times \cos \phi \times \cos \theta$ may be changed by fixing the direction of the chemical liquid nozzle 71 and changing $V_C$ only.

The following table shows whether the immediate deviation of the etching solution occurs (marked with x) or the diffusion of the etching solution occurs (marked with ○) based on combinations of the flow rate of the etching solution to be supplied to the nozzle which is in proportion to $V_C$ and the rotational velocity of the wafer W which is in proportion to $V_T$ when the value of $V_C \times \cos \phi \times \cos \theta$ is changed by fixing the direction of the chemical liquid nozzle 71 and changing $V_C$ only.

TABLE 1

|  | Rotational velocity (rpm) | | | | | |
| --- | --- | --- | --- | --- | --- | --- |
|  | 100 | 600 | 1200 | 1800 | 2500 | 3000 |
| Flow rate (ml/min) 5 | ○ | ○ | x | x | x | x |
| 7 | ○ | ○ | ○ | x | x | x |
| 10 | ○ | ○ | ○ | ○ | x | x |
| 15 | ○ | ○ | ○ | ○ | ○ | ○ |
| 20 | ○ | ○ | ○ | ○ | ○ | ○ |
| 25 | ○ | ○ | ○ | ○ | ○ | ○ |

According to the result shown in Table 1, it is possible to presume that the value of $V_T/(V_C \times \cos \phi \times \cos \theta)$ can be a reference to determine whether the immediate deviation of the etching solution occurs or the diffusion of the etching solution occurs.

The deviation of the etching solution from the wafer W immediately after landing on the wafer W means that the etching solution is rebounded or splashed. When the etching solution is rebounded, the mist of the etching solution floats near the wafer W. Re-adherence of the mist of the etching solution on the wafer W may cause the generation of particles. This problem can be overcome by optimizing the gas flow on the peripheral portion of the wafer W (for example, by employing the technology described in Patent Document 1 or increasing the exhaust amount of the cup body 2). Also, in the conventional technology, a processing is performed under the diffusion conditions to suppress the generation of the mist.

Under the immediate deviation conditions, the etching solution does not diffuse around the liquid landing point but immediately deviates from the wafer W, and, thus, only the liquid landing point is etched. For this reason, it is possible to precisely control the position of the boundary between an area to be etched and an area not to be etched. Also, there is no chance that an unintended area will be etched by the diffusion.

In the strict sense, the etching solution lands not at a point but on a plane on the front surface of the wafer W. That is, a figure surrounded by a line intersection between a liquid column of the etching solution discharged from the chemical liquid nozzle 71 and the front surface of the wafer W is approximately circular or oval in shape, and has a limited area. However, in the present disclosure, the entire figure surrounded by the line intersection is referred to as "liquid landing point" for convenience of explanation.

In the present exemplary embodiment, a wet etching processing is performed under the immediate deviation conditions or under a combination of the immediate deviation conditions and the diffusion conditions, and, thus, it is possible to selectively etch only an intended portion of the wafer W with high precision. Also, the diffusion conditions can be applied when an etching target area which does not need to be precisely controlled is etched or when a wide area is etched at one time and thus make it simple to control the operation of the substrate processing apparatus.

Hereinafter, specific examples of etching a film (denoted by symbol F in FIG. 7A and FIG. 7B, FIG. 8A and FIG. 8B, FIG. 10A to FIG. 10C and FIG. 11) formed on the front surface (rear surface) of the wafer W will be described. In the following description, it is assumed that the peripheral portion of the wafer W has a round shape.

Experimental Example 1

Figure 7A:
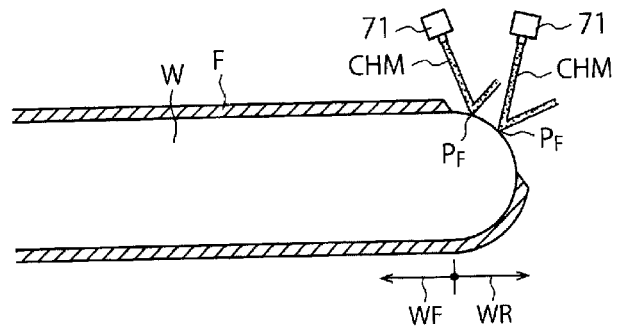
FIG. 7A and FIG. 7B are diagrams provided to explain an experimental example 1.

In an experimental example 1, both a flat part and a round part of the peripheral portion on the front surface of the wafer W are etched under the immediate deviation conditions. First, as illustrated in FIG. 7A, the round part (semi-circular part having a circular arc and represented by symbol WR in FIG. 7A) is etched (first etching process). In this case, as the liquid landing point $P_F$ is moved along the round part, an incident angle (approximately corresponding to the angle $\phi$) of the etching solution to the front surface of the wafer W (i.e., front surface of the round part) is changed. For this reason, the liquid landing point $P_F$ is moved while the direction of the chemical liquid nozzle 71 is changed such that the immediate deviation conditions can be maintained regardless of the position of the liquid landing point $P_F$. In this case, the direction of the chemical liquid nozzle 71 may be changed to change at least one of the angle $\phi$ or the angle $\theta$ (for example, only the angle $\phi$). As the liquid landing point $P_F$ is moved, the rotational velocity of the wafer W or the flow rate of the etching solution to be discharged from the chemical liquid nozzle 71 may be changed. The liquid landing point $P_F$ may be moved to go away from the flat part (flat portion continuing from the round part) or may be moved to be close to the flat part.

Figure 7B:
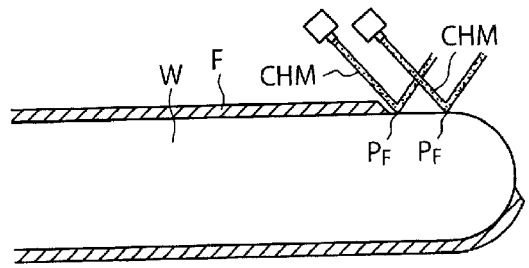

Then, as illustrated in FIG. 7B, the flat part WF (flat portion represented by symbol WF in FIG. 7A) is etched (second etching process). When the flat part is etched, the change of the incident angles, which is caused by the movement of the liquid landing point $P_F$, (both the angle $\phi$ and the angle $\theta$) of the etching solution to the front surface of the wafer W are not made. Therefore, when the flat part is etched, the immediate deviation conditions can be maintained even if the angle $\phi$, the angle $\theta$, the rotational velocity of the wafer W and the flow rate of the etching solution to be discharged from the chemical liquid nozzle 71 are maintained approximately constant. In this case, the liquid landing point $P_F$ may be moved radially inwards to go away from the round part, and if the liquid landing point $P_F$ is moved to a position corresponding to a desired cut width (i.e., distance from the edge of the wafer W), the discharge of the etching solution from the chemical liquid nozzle 71 is stopped. On the contrary, the liquid landing point $P_F$ may be moved to be close to the round part.

In the experimental example 1, the flat part may be etched first, and then the round part may be etched.

Experimental Example 2

Figure 8A:
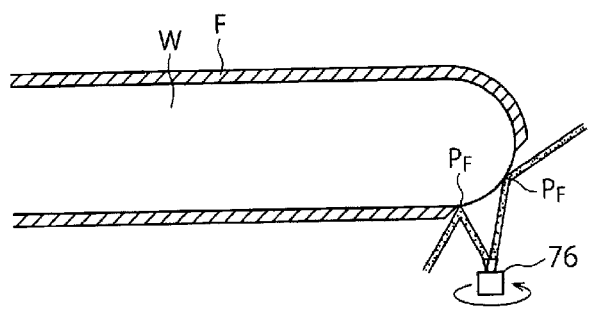
FIG. 8A and FIG. 8B are diagrams provided to explain an experimental example 2.
Figure 8B:
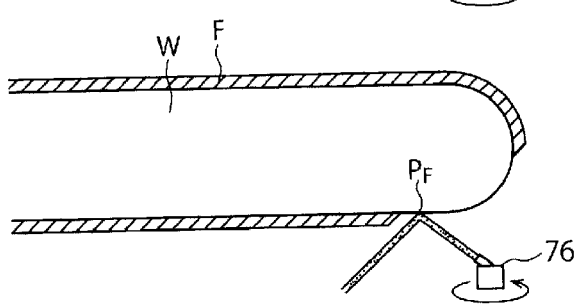

In an experimental example 2, as illustrated in FIG. 8A, a round part of the rear surface of the wafer W is etched under the immediate deviation conditions (first etching process), and then, as illustrated in FIG. 8B, the flat part is etched under the immediate deviation conditions (second etching process). In this case, the round part and the flat part are etched while moving the liquid landing point $P_F$ by moving the discharge member 76a of the rear surface nozzle 76 (see FIG. 5). Also, the angle $\phi$ and the angle $\theta$ of the rear surface nozzle 76 illustrated in FIG. 5 are determined depending on the liquid landing point $P_F$ due to the structural characteristics thereof, and the liquid landing point $P_F$, the angle $\phi$ and the angle $\theta$ cannot be controlled independently. For this reason, as the liquid landing point $P_F$ is moved, the rotational velocity of the wafer W or the flow rate of the etching solution to be discharged from the rear surface nozzle 76 is controlled to maintain the immediate deviation conditions. If a mechanism configured to change an elevation angle of the discharge opening of the rear surface nozzle 76 is additionally provided at the rear surface nozzle 76 illustrated in FIG. 5, the angle $\phi$ can be controlled independently. Therefore, it becomes easy to maintain the immediate deviation conditions.

Experimental Example 3

Figure 9:
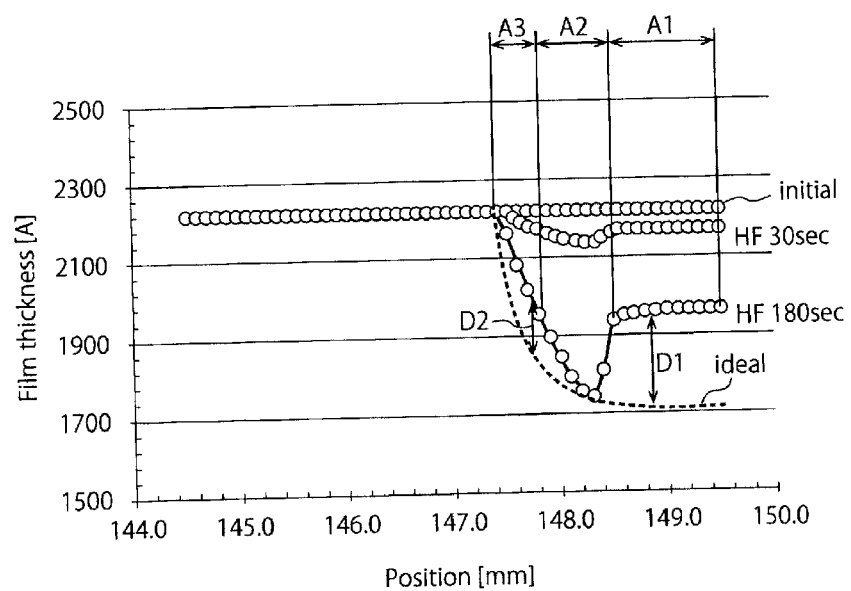
FIG. 9 is a graph provided to explain an experimental example 3.
Figures 10A, 10B, 10C:
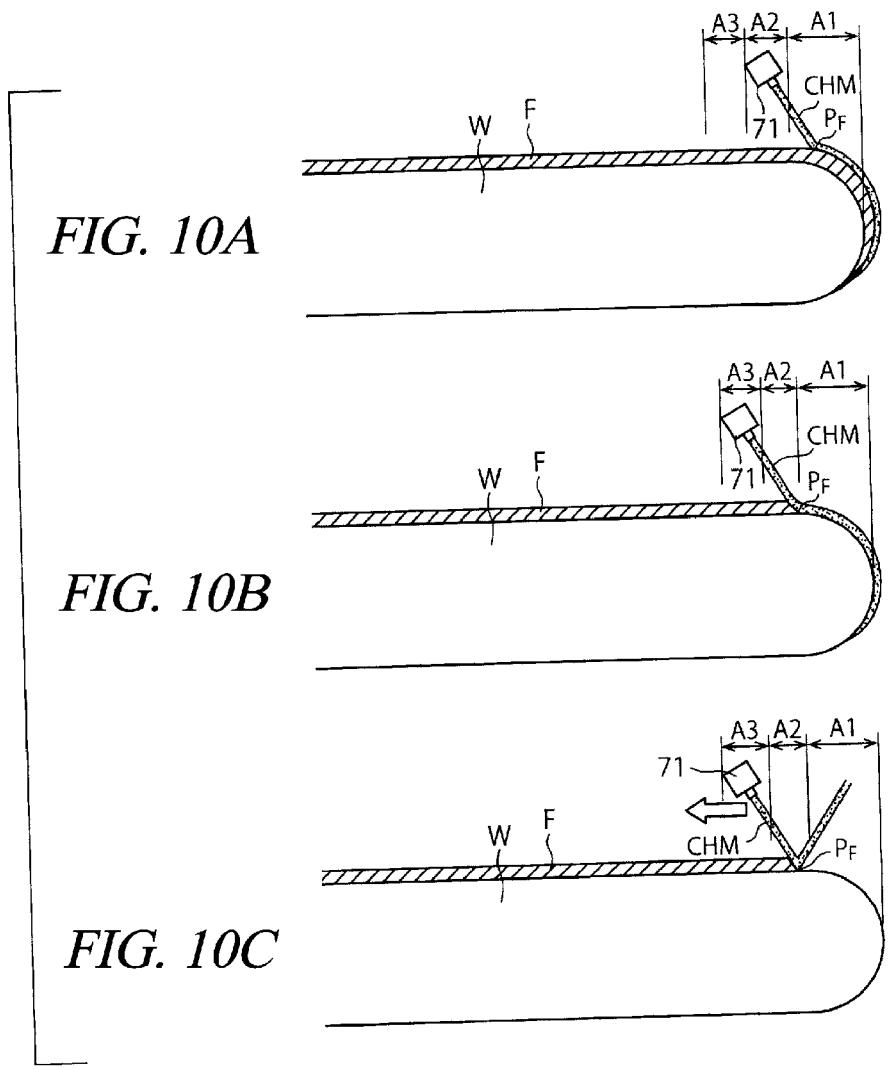
FIG. 10A to FIG. 10C are diagrams provided to explain the experimental example 3.

An experimental example 3 will be described with reference to FIG. 9 to FIG. 10C. Prior to description of the experimental example 3, a comparative example of the experimental example 3 will be described. If the wafer W on which the film is formed as illustrated in FIG. 10A is etched under the diffusion conditions in a state where the liquid landing point is fixed at a position on a radially inner side than a round part (within an area A2 described in the graph of FIG. 9), a distribution of an etching amount as shown in FIG. 9 is obtained. Areas A1, A2 and A3 shown in FIG. 9 are etching target areas. The area A1 is a round part, the area A2 is a flat part located on the radially inner side than the round part, and the area A3 is a flat part located on the radially inner side than the area A2.

In the graph of FIG. 9, a horizontal axis represents a radial position (unit: mm) on the wafer W and 150.0 mm is the position of the edge of the 12-inch wafer W. A longitudinal axis represents a film thickness (unit: Å) of the etching target film. As the film thickness, a change in the film thickness rather than the value of the film thickness itself is observed.

In the graph of FIG. 9, a horizontal line (approximately corresponding to 2200 Å) described as "initial" represents an initial film thickness distribution of the etching target film, and an etching target area is approximately uniform in the initial film thickness. In the same graph, a curve descried as "ideal" is an ideal etching profile. Also, curves described as "HF 30 sec" and "HF 180 sec" are etching profiles obtained when the etching is performed for 30 seconds and 180 seconds, respectively, under the diffusion conditions in a state where the liquid landing point is fixed within the area A2. The etching solution is hydrofluoric acid, and the etching target film is a silicon nitride (SiN) film.

As for the case of "HF 180 sec", the etching amount in the area A1 is greatly insufficient compared to the ideal etching amount and the etching amount in the area A3 is slightly insufficient compared to the ideal etching amount. If the etching time is increased to make the insufficient etching amount close to the ideal etching amount, a base film of the area A2 may be over-etched beyond an allowable limit.

The experimental example 3 may be used to achieve the ideal etching profile. In the experimental example 3, the etching is performed under the combination of the immediate deviation conditions and the diffusion conditions.

In the experimental example 3, first, as illustrated in FIG. 10A, the liquid landing point $P_F$ is located in the area A1 near the boundary between the area A1 and the area A2 and the area A1 (round part) is etched under the diffusion conditions (first etching process). In this case, the liquid landing point $P_F$ may be moved at a low speed by moving the chemical liquid nozzle 71. Desirably, in this etching process, the area A1 may be etched by a film thickness approximately corresponding to a difference D1 (see FIG. 9) between the film thickness on the "HF 180 sec" curve and the film thickness on the "ideal" curve.

Then, as illustrated in FIG. 1013, the liquid landing point $P_F$ is located in the area A2 near the boundary between the area A1 and the area A2 and the area A2 (flat part) is etched under the diffusion conditions (second etching process). The etching conditions are the same as in the comparative example (for example, conditions for obtaining the film thickness distribution curve described as "HF 180 sec"). The liquid landing point $P_F$ may be fixed at a specific radial position in the area A2 or may be slightly moved from the specific radial position. In this case, the etching is performed under the diffusion conditions, and, thus, the etching solution is diffused to the area A1 (round part). Therefore, the area A1 is also etched. When the second etching process is ended, the film thickness distribution approximately corresponding to the "ideal" curve except a film thickness difference D2 shown in FIG. 9 can be obtained.

Finally, as illustrated in FIG. 10C, the liquid landing point $P_F$ is located in the area A2 (flat part) and the inside of the area A3 is etched under the immediate deviation conditions while moving the liquid landing point $P_F$ to the innermost peripheral portion of the area A3 (third etching process). The liquid landing point is slowly moved to a radially inner position, and when the etching is completed to a target cut area, the discharge of the etching solution from the chemical liquid nozzle 71 is ended. In this case, the moving velocity of the chemical liquid nozzle 71 may be changed to etch a thickness corresponding to the film thickness difference D2 shown in FIG. 9. In this case, the moving velocity of the chemical liquid nozzle 71 may be decreased in a part having a large film thickness difference D2.

A film thickness distribution close to the "ideal" curve shown in FIG. 9 can be obtained by performing the first to third etching processes as described above. Also, the condition range for maintaining the diffusion is broader than the condition range for maintaining the immediate deviation. Therefore, it is generally easy to manage the etching conditions.

Experimental Example 4

Figure 11:
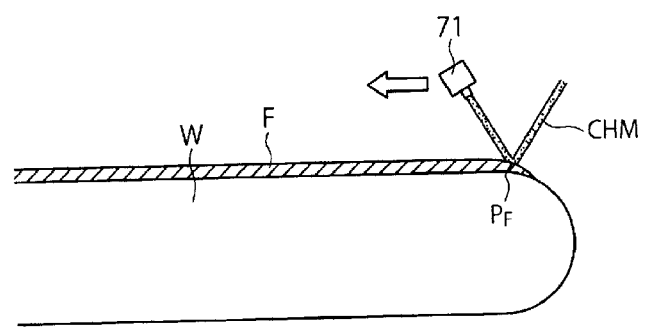
FIG. 11 is a diagram provided to explain an experimental example 4.

An experimental example 4 relates to a bevel wet etching of the wafer W on which the etching target film is formed only on the flat part and a portion of the front surface of the round part as illustrated in FIG. 11. This film thickness distribution can be seen when the etching target film on the round part is previously removed by a bevel dry etching or when CVD film formation is performed on a focus ring to suppress the formation of the etching target film on the round part.

In the experimental example 4, the entire etching target area is etched under the immediate deviation conditions while moving the liquid landing point $P_F$ from the outermost peripheral portion of the film toward a radially inner side. Therefore, the etching solution is not brought into contact with the portion of the round part where the film is not formed, and, thus, only a desired area can be etched. Accordingly, it is possible to suppress the etching of a part where the etching target film is not formed.

According to the above-described exemplary embodiment, the etching solution is supplied to the wafer W to satisfy the immediate deviation conditions, and, thus, it is possible to precisely control the cut width (removal range of the film by the etching). Also, if the etching is performed as in the comparative example of the experimental example 3, when the liquid landing point is close to the boundary between the round part and the flat part to reduce the cut width to, for example, about 0.5 mm or less, some of the etching solution may land on the flat part and the rest lands on the round part. (The term "cut width" also refers to the distance from the edge of the wafer to the boundary as measured in the radial direction of the wafer.) In this case, the etching solution diffuses differently between in the flat part and in the round part, and, thus, disorder occurs on the liquid film of the etching solution. As a result, the boundary between the etched area and the non-etched area is waved and thus becomes non-uniform. However, under the immediate deviation conditions, the etching solution landing on the wafer W immediately deviates from the wafer W. Therefore, even if the liquid landing point is set on the boundary between the round part and the flat part, the above-described problem does not occur.

According to the exemplary embodiments, it is possible to precisely control the removal range of any unnecessary film.

The exemplary embodiments disclosed herein are illustrative and do not limit the present disclosure. The above-described exemplary embodiments may be omitted, substituted, or changed in various forms without departing from the scope and spirit of the appended claims.

From the foregoing, it will be appreciated that various exemplary embodiments of the present disclosure have been described herein for the purposes of illustration, and that various modifications may be made without departing from the scope and spirit of the present disclosure. Accordingly, the various exemplary embodiments disclosed herein are not intended to be limiting, with the true scope and spirit being indicated by the following claims.

I claim:

1. An etching apparatus, comprising:
a substrate holder configured to hold a substrate;
a rotation driver configured to rotate the substrate holder around a rotation axis;
a liquid discharge unit configured to discharge an etching solution to a peripheral portion of the substrate held by the substrate holder; and
a controller configured to control an operation of the etching apparatus by controlling at least the rotation driver and the liquid discharge unit,
wherein the controller configured to control at least one of a rotational velocity of the substrate to be rotated by the rotation driver, a discharge velocity of the etching solution from the liquid discharge unit or a discharge direction of the etching solution from the liquid discharge unit to etch the substrate under immediate deviation conditions in which the etching solution is deviated from the substrate immediately after the etching solution discharged from the liquid discharge unit lands at a liquid landing point in the peripheral portion of the substrate,
wherein a circle, which centers around a foot of a perpendicular line drawn from the liquid landing point to the rotation axis and has a radius corresponding to a segment line from the foot of the perpendicular line to the liquid landing point in a plane perpendicular to the rotation axis, is defined, and a direction of a tangent to the circle at the liquid landing point is defined as a tangential direction,
when a liquid processing is performed on the substrate under the immediate deviation conditions, the controller configured to control at least one of the rotation driver or the liquid discharge unit to supply the etching solution to the substrate under a condition in which a ratio of a velocity of the tangential direction of the substrate at the liquid landing point to a velocity component of the tangential direction of the etching solution at the liquid landing point is greater than a predetermined value, wherein the velocity component of the tangential direction of the etching solution at the liquid landing point is represented by $V_C \times \cos \varphi \times \cos \theta$, and wherein $V_C$ is a discharge velocity of the etching solution, $\varphi$ is an angle between a straight line connecting a foot of a perpendicular line drawn from a discharge point of the etching solution to a front surface of the substrate and the liquid landing point and a straight line connecting the discharge point and the liquid landing point, and $\theta$ is an angle between the straight line connecting the foot of the perpendicular line drawn from the discharge point of the etching solution to the front surface of the substrate and the liquid landing point and a tangent to the circle at the liquid landing point.

2. The etching apparatus of claim 1,
wherein the liquid discharge unit includes a nozzle configured to discharge the etching solution, a nozzle moving mechanism configured to move the nozzle, a nozzle direction control mechanism configured to control a direction of the nozzle and a flow rate control mechanism configured to control the discharge velocity of the etching solution from the nozzle by controlling a flow rate of the etching solution to be supplied to the nozzle.

3. The etching apparatus of claim 1,
wherein the controller configured to control the liquid discharge unit to move the liquid landing point within a predetermined etching target area in the peripheral portion of the substrate.

4. The etching apparatus of claim 1,
wherein the liquid discharge unit includes a nozzle configured to discharge the etching solution, a nozzle moving mechanism configured to move the nozzle, a nozzle direction control mechanism configured to control a direction of the nozzle and a flow rate control mechanism configured to control the discharge velocity of the etching solution from the nozzle by controlling a flow rate of the etching solution to be supplied to the nozzle.

5. The etching apparatus of claim 4,
wherein when a round part having an approximately semicircular shape in the peripheral portion of the substrate is etched, while moving the liquid landing point of the etching solution by moving the nozzle through the nozzle moving mechanism, the controller is configured to perform, along with the moving of the liquid landing point, at least one of a control of the direction of the nozzle by the nozzle direction control mechanism, a control of the discharge velocity of the etching solution by the flow rate control mechanism or a control of the rotational velocity of the substrate by the rotation driver to maintain the immediate deviation conditions.

6. The etching apparatus of claim 4,
wherein the controller configured to control the liquid discharge unit to move the liquid landing point within a predetermined etching target area in the peripheral portion of the substrate.

7. The etching apparatus of claim 4,
wherein the controller configured to control at least one of the rotational velocity of the substrate to be rotated by the rotation driver, the discharge velocity of the etching solution from the liquid discharge unit or the discharge direction of the etching solution from the liquid discharge unit to perform a liquid processing on the substrate even under diffusion conditions in which the etching solution discharged from the liquid discharge unit is diffused on the peripheral portion of the substrate to cover an area radially outside the liquid landing point after landing on the peripheral portion of the substrate and then is deviated from the substrate, and the controller configured to control the etching apparatus to process a single substrate under a combination of the immediate deviation conditions and the diffusion conditions.

8. The etching apparatus of claim 1,
wherein the controller configured to control the liquid discharge unit to move the liquid landing point within a predetermined etching target area in the peripheral portion of the substrate.

9. The etching apparatus of claim 1,
wherein the controller configured to control at least one of the rotational velocity of the substrate to be rotated by the rotation driver, the discharge velocity of the etching solution from the liquid discharge unit or the discharge direction of the etching solution from the liquid discharge unit to perform a liquid processing on the substrate even under diffusion conditions in which the etching solution discharged from the liquid discharge unit is diffused on the peripheral portion of the substrate to cover an area radially outside the liquid landing point after landing on the peripheral portion of the substrate and then is deviated from the substrate, and the controller configured to control the etching apparatus to process a single substrate under a combination of the immediate deviation conditions and the diffusion conditions.

10. The etching apparatus of claim 9,
wherein the controller configured to control the rotation driver and the liquid discharge unit to etch an etching target film remaining at least a part of an area which has been etched under the diffusion conditions under the immediate deviation conditions.

11. An etching method, comprising:
providing a substrate holder to hold a substrate;
providing a rotation driver to rotate the substrate holder around a rotation axis;
providing a liquid discharge unit to discharge an etching solution;
providing a controller configured to control at least the rotation driver and the liquid discharge unit;
performing a first liquid processing by discharging the etching solution toward a peripheral portion of the substrate being rotated from the liquid discharge unit,
wherein the first liquid processing is performed under immediate deviation conditions in which the etching solution discharged from the liquid discharge unit is deviated from the substrate immediately after landing at a liquid landing point in the peripheral portion of the substrate by setting a rotational velocity of the substrate, a discharge velocity of the etching solution from the liquid discharge unit and a discharge direction of the etching solution from the liquid discharge unit,
defining a circle, which centers around a foot of a perpendicular line drawn from the liquid landing point to the rotation axis and has a radius corresponding to a segment line from the foot of the perpendicular line to the liquid landing point in a plane perpendicular to the rotation axis, and defining a tangential direction as a direction of a tangent to the circle at the liquid landing point,
when performing the first liquid processing on the substrate under the immediate deviation conditions, controlling the substrate holder or the liquid discharge unit to supply the etching solution to the substrate under a condition in which a ratio of a velocity of the tangential direction of the substrate at the liquid landing point to a velocity component of the tangential direction of the etching solution at the liquid landing point is greater than a predetermined value, wherein the velocity component of the tangential direction of the etching solution at the liquid landing point is represented by $V_C \times \cos \varphi \times \cos \theta$, and wherein $V_C$ is a discharge velocity of the etching solution, $\varphi$ is an angle between a straight line connecting a foot of a perpendicular line drawn from a discharge point of the etching solution to a front surface of the substrate and the liquid landing point and a straight line connecting the discharge point and the liquid landing point, and $\theta$ is an angle between the straight line connecting the foot of the perpendicular line drawn from the discharge point of the etching solution to the front surface of the substrate and the liquid landing point and a tangent to the circle at the liquid landing point.

12. The etching method of claim 11,
wherein, in the performing of the first liquid processing, the liquid landing point is moved within a predetermined etching target area in the peripheral portion of the substrate.

13. The etching method of claim 12,
wherein, in the performing of the first liquid processing, the liquid landing point is moved from a radially outer position toward a radially inner position within the etching target area.

14. The etching method of claim 11, further comprising:
performing a second liquid processing by discharging the etching solution toward the peripheral portion of the substrate being rotated from the liquid discharge unit,
wherein the second liquid processing is performed by setting the rotational velocity of the substrate, the discharge velocity of the etching solution from a nozzle and the discharge direction of the etching solution from the nozzle such that the etching solution discharged from the nozzle is diffused on the peripheral portion of the substrate to cover an area radially outside the liquid landing point after landing at the liquid landing point in the peripheral portion of the substrate and then is deviated from the substrate.

* * * * *

UNITED STATES PATENT AND TRADEMARK OFFICE
CERTIFICATE OF CORRECTION

PATENT NO. : 11,164,760 B2
APPLICATION NO. : 16/919167
DATED : November 2, 2021
INVENTOR(S) : Akira Fujita It is certified that error appears in the above-identified patent and that said Letters Patent is hereby corrected as shown below:

In the Specification

Column 14, Line 66 "FIG. 1013" should be -- FIG. 10B --.

Signed and Sealed this
Twenty-eighth Day of June, 2022

Katherine Kelly Vidal
*Director of the United States Patent and Trademark Office*